US012707184B2

(12) United States Patent
Kim et al.

(10) Patent No.: US 12,707,184 B2
(45) Date of Patent: Aug. 11, 2026

(54) AUDIO DEVICE WITH CONNECTION TERMINAL AND SENSOR

(71) Applicant: Samsung Electronics Co., Ltd., Gyeonggi-do (KR)

(72) Inventors: Hongki Kim, Gyeonggi-do (KR); Donghan Lee, Gyeonggi-do (KR); Hyunmin Oh, Gyeonggi-do (KR); Jungsoo Kim, Gyeonggi-do (KR); Chijeong Choi, Gyeonggi-do (KR); Yongsang Yun, Gyeonggi-do (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 356 days.

(21) Appl. No.: 18/220,875

(22) Filed: Jul. 12, 2023

(65) Prior Publication Data

US 2023/0353925 A1 Nov. 2, 2023

Related U.S. Application Data

(63) Continuation of application No. PCT/KR2021/019730, filed on Dec. 23, 2021.

(30) Foreign Application Priority Data

Jan. 13, 2021 (KR) ........................ 10-2021-0004853

(51) Int. Cl.
*H04R 1/10* (2026.01)
*H01R 13/52* (2006.01)
(Continued)

(52) U.S. Cl.
CPC ....... *H04R 1/1058* (2013.01); *H01R 13/5202* (2013.01); *H04R 1/44* (2013.01); *H05K 5/069* (2013.01)

(58) Field of Classification Search
CPC ......................... H01R 13/5202; H04R 1/1075; H04R 1/1058; H04R 1/44; H04R 2499/11;
(Continued)

(56) References Cited

U.S. PATENT DOCUMENTS 8,737,665 B2 5/2014 Chung et al.
8,744,111 B2 6/2014 Chu
(Continued)

FOREIGN PATENT DOCUMENTS

JP 2012-99948 A 5/2012
KR 10-1006711 B1 1/2011
(Continued)

OTHER PUBLICATIONS

Korean Office Action dated Feb. 14, 2025.

*Primary Examiner* — Norman Yu
(74) *Attorney, Agent, or Firm* — CANTOR COLBURN LLP

(57) ABSTRACT

An electronic device is disclosed, including a housing, and an interface structure disposed at least partly in the housing. Th interface structure includes: a substrate, a connection terminal disposed on the substrate, a part of which is exposed to an external environment through a first opening of the housing, a sealing part disposed where the substrate and the connection terminal are connected, blocking exposure of the connected portion to the external environment, a sensor disposed on the substrate adjacent to the connection terminal, a window member disposed on the substrate to cover the sensor while exposing at least a portion of the sensor to the external environment through a second opening of the housing, and a waterproofing member disposed between the window member and the substrate to form a seal between a portion of the window member and the substrate.

17 Claims, 8 Drawing Sheets

(51) Int. Cl.
*H04R 1/44* (2006.01)
*H05K 5/06* (2006.01)

(58) Field of Classification Search
CPC ...... H04R 2460/11; H04R 1/02; H04R 1/086; H05K 5/069
USPC ....... 381/334, 374, 376, 189, 311, 370, 386, 381/322, 328, 361, 355, 371
See application file for complete search history.

(56) References Cited

U.S. PATENT DOCUMENTS

| | | | |
|---|---|---|---|
| 9,414,154 B2 | 8/2016 | Tung et al. | |
| 9,510,076 B2 | 11/2016 | Lee et al. | |
| 10,582,287 B2 | 3/2020 | Song et al. | |
| 10,827,249 B1 | 11/2020 | Pine et al. | |
| 2013/0004011 A1 | 1/2013 | Hayashida et al. | |
| 2014/0191874 A1 | 7/2014 | Stevens et al. | |
| 2015/0110320 A1* | 4/2015 | Liu | H04R 1/44 381/322 |
| 2017/0163778 A1* | 6/2017 | Noma | H04M 1/00 |
| 2018/0115811 A1* | 4/2018 | Zhang | H04R 1/086 |
| 2018/0184186 A1 | 6/2018 | Kang et al. | |
| 2020/0107101 A1 | 4/2020 | Grinker et al. | |

FOREIGN PATENT DOCUMENTS

| | | |
|---|---|---|
| KR | 10-2011-0115720 A | 10/2011 |
| KR | 10-2013-0082123 A | 7/2013 |
| KR | 10-1861690 B1 | 5/2018 |
| KR | 10-2018-0064096 A | 6/2018 |
| KR | 10-2019-0021033 A | 3/2019 |

* cited by examiner

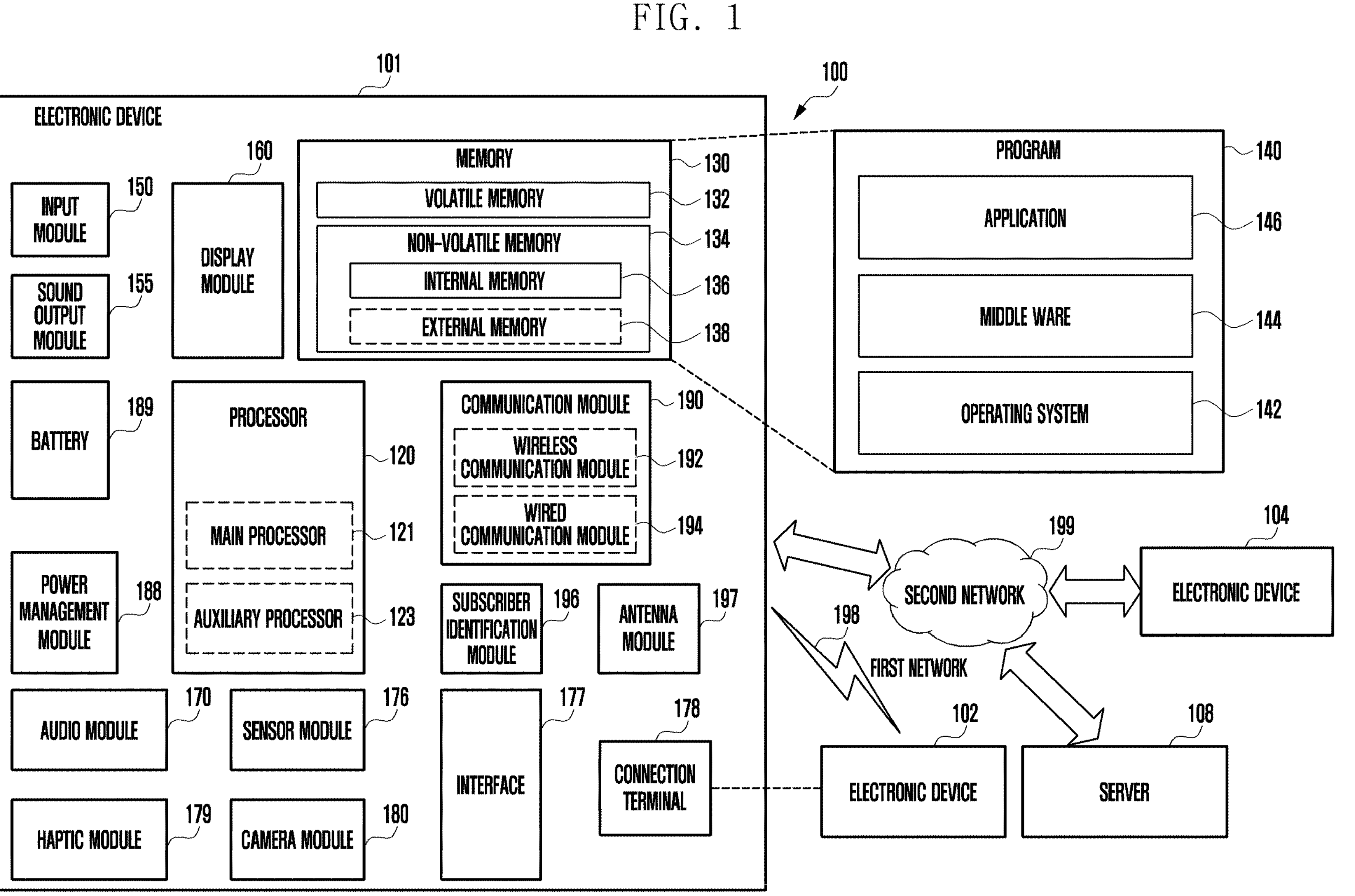
FIG. 1
101
100
ELECTRONIC DEVICE
INPUT MODULE
150
DISPLAY MODULE
160
SOUND OUTPUT MODULE
155
MEMORY
130
VOLATILE MEMORY
132
NON-VOLATILE MEMORY
134
INTERNAL MEMORY
136
EXTERNAL MEMORY
138
PROGRAM
140
APPLICATION
146
MIDDLE WARE
144
OPERATING SYSTEM
142
BATTERY
189
PROCESSOR
120
MAIN PROCESSOR
121
AUXILIARY PROCESSOR
123
COMMUNICATION MODULE
190
WIRELESS COMMUNICATION MODULE
192
WIRED COMMUNICATION MODULE
194
POWER MANAGEMENT MODULE
188
SUBSCRIBER IDENTIFICATION MODULE
196
ANTENNA MODULE
197
SECOND NETWORK
199
ELECTRONIC DEVICE
104
198
FIRST NETWORK
AUDIO MODULE
170
SENSOR MODULE
176
INTERFACE
177
CONNECTION TERMINAL
178
ELECTRONIC DEVICE
102
SERVER
108
HAPTIC MODULE
179
CAMERA MODULE
180

FIG. 7

AUDIO DEVICE WITH CONNECTION TERMINAL AND SENSOR

CROSS-REFERENCE TO RELATED APPLICATION(S)

This application is a continuation of International Application No. PCT/KR2021/019730, which was filed on Dec. 23, 2021 and claims priority to Korean Patent Application No. 10-2021-0004853, filed on Jan. 13, 2021, in the Korean Intellectual Property Office, the disclosures of which are incorporated by reference herein their entirety.

TECHNICAL FIELD

Certain embodiments disclosed in the present disclosure relate to audio devices, and more particular, to an audio device with environmental proofing configured to avoid degradation in output sound quality and volume.

BACKGROUND

An audio device is an electronic device that receives an audio signal and outputs a sound that is audible to a user. To increase convenience of such devices, audio devices have increasingly utilized wireless connections for connecting to external electronic devices have been released to the market.

SUMMARY

Some audio devices (e.g., such as an earphone or an earbud) may be worn on a user's ear (e.g., by mounting on the ear canal).

Such audio devices may receive voice inputs and/or sound from an external environment using a microphone, and output sound using a speaker.

For example, the audio device may process voice and/or sound that is input through the microphone into an electrical signal, convert the electrical signal into sound through a speaker module, and output the converted sound (e.g., by transmission to an external device to which it is paired).

Some audio devices include waterproofing so as to seal an inner space or inlet periphery of a nozzle. However, when waterproofing is implemented, the quality and volume of output sound through the speaker may be degraded.

Audio devices may include connection terminals that are exposed to the external environment of the electronic device, and various sensors as well. Various convenient functions may be provided through connection terminals and sensors. However, as the count and complexity of such components increases within these audio devices, efficient design of such audio devices becomes more challenging.

Certain embodiments disclosed in the present disclosure may reduce volume degradation and/or sound quality degradation by omitting a waterproofing structure at a portion where sound is output by the audio device. Furthermore, degradations may be reduced by changing the structure, including for that of a connection terminal and a sensor.

According to certain embodiments of the disclosure, an electronic device is disclosed, including: a housing, and an interface structure at least partly disposed in the housing, wherein the interface structure includes: a connection terminal disposed on the substrate such that at least a portion of the connection terminal is exposed to an external environment through a first opening of the housing, a sealing part disposed where the substrate and the connection terminal are connected, so as to block exposure of the connected portion to the external environment, a sensor disposed on the substrate in a position adjacent to the connection terminal, a window member that is disposed on the substrate so as to cover the sensor while exposing at least a portion of the sensor to the external environment through a second opening of the housing, and a waterproofing member disposed between the window member and the substrate so as to form a seal between a portion of the window member and the substrate.

According to certain embodiments of the disclosure, an electronic device is disclosed, including: a housing, a bracket disposed within the housing so as to divide the housing into a first space and a second space, an airtight member disposed between the housing and the bracket, blocking connection between the first space and the second space, a substrate member including a first substrate disposed in the first space, a second substrate disposed in the second space, and a substrate connection part connecting the first substrate and the second substrate, and an interface structure including a sensor and a connection terminal, the interface structure disposed on the first substrate of the substrate member, wherein the substrate connection part of the substrate member connects the first substrate and the second substrate, by at least a portion of the substrate connection part that passes through a groove formed on the bracket.

According to certain embodiments disclosed in the present disclosure, sound generated by an audio device may be transmitted to a user's ear without passing through a waterproof structure, so as to reduce degradation of audio quality typically caused by waterproofing. According to certain embodiments disclosed in the present disclosure, it is possible to provide a waterproof structure that does not degrade the sound output by the audio device. According to certain embodiments disclosed in the present disclosure, the inner space of the electronic device may be utilized more efficiently by altering the arrangements and/or structure of electronic components included in the audio device.

BRIEF DESCRIPTION OF THE DRAWINGS

In connection with the description of the drawings, the same or similar reference numerals may be used for the same or similar elements.

FIG. 1 is a block diagram of an electronic device in a network environment, according to certain embodiments.

FIG. 7 is a cross-sectional view of the interface structure in which region P of FIG. 3 is enlarged.

DETAILED DESCRIPTION

Figure 2:
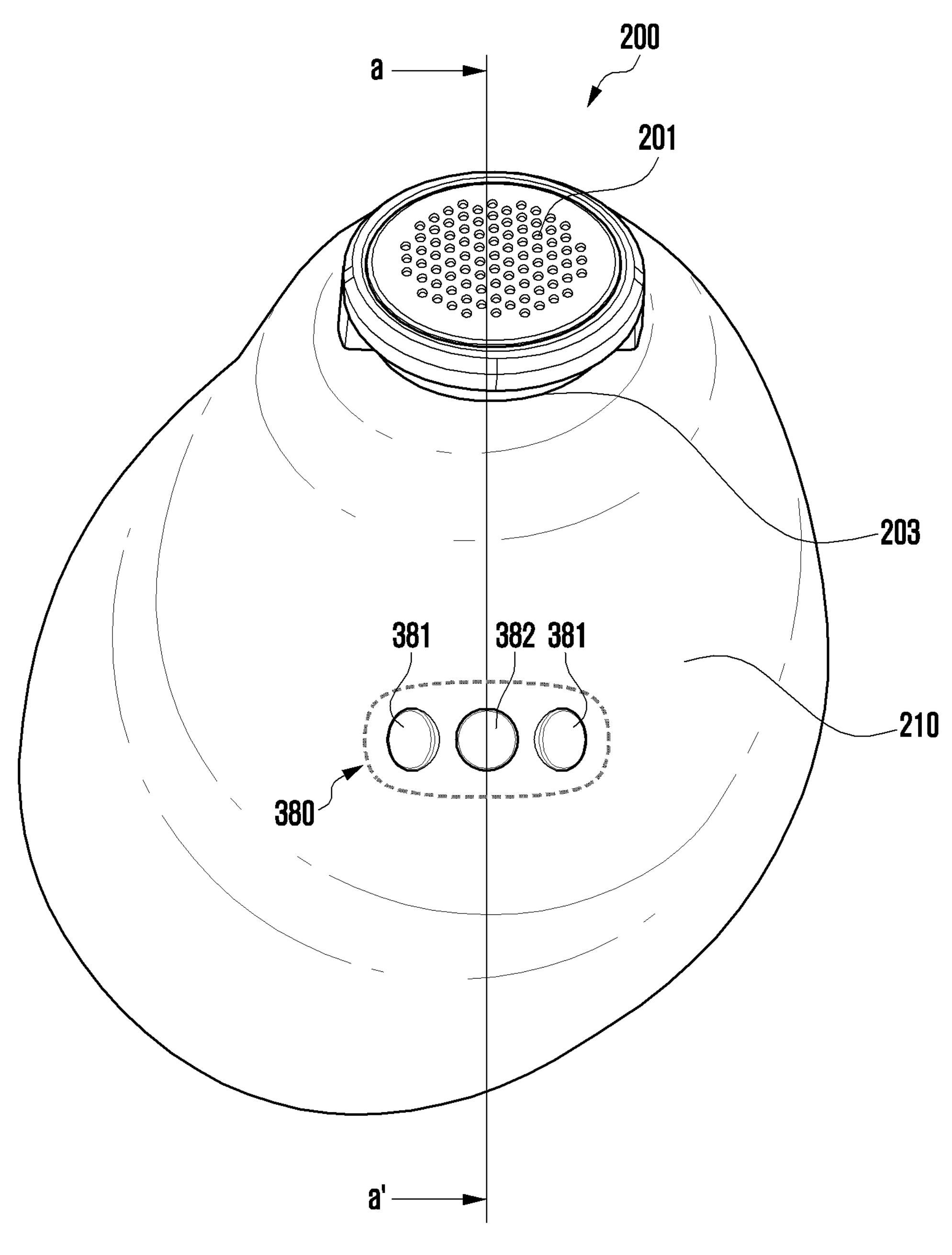
FIG. 2 is a perspective view illustrating an external appearance of an electronic device according to certain embodiments of the present disclosure.

It should be appreciated that certain embodiments of this disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. The singular form of a noun corresponding to an item may include one item or a plurality of items unless the relevant context clearly indicates otherwise.

In the present disclosure, each of such phrases as "A or B", "at least one of A and B", "or at least one of B," "A, B, or C," "at least one of A, B, and C," and "B, or at least one of C" may include any one of, or all possible combinations of the items enumerated together in a corresponding one of the phrases. Such terms as "1st" and "2nd" or "first" and "second" may be used to simply distinguish a corresponding component from another, and do not limit the components in another aspect (e.g., importance or order). If an element (e.g., the first) is referred to, with or without the term "operatively" or "communicatively", as "coupled" or "connected" to another element (e.g., the second), it means that the element may be coupled with the other element directly (e.g., wiredly), wirelessly, or via a third element.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input 1 module 150, a sound output 1 module 155, a display 1 module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display 1 module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input 1 module 150 may receive a command or data to be used by another component (e.g., the processor 120) of the electronic device 101, from the outside (e.g., a user) of the electronic device 101. The input 1 module 150 may include, for example, a microphone, a mouse, a keyboard, a key (e.g., a button), or a digital pen (e.g., a stylus pen).

The sound output module 155 may output sound signals to the outside of the electronic device 101. The sound output 1 module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display 1 module 160 may visually provide information to the outside (e.g., a user) of the electronic device 101. The display 1 module 160 may include, for example, a display, a hologram device, or a projector and control circuitry to control a corresponding one of the display, hologram device, and projector. According to an embodiment, the display 1 module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input 1 module 150, or output the sound via the sound output 1 module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of Ims or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 3:
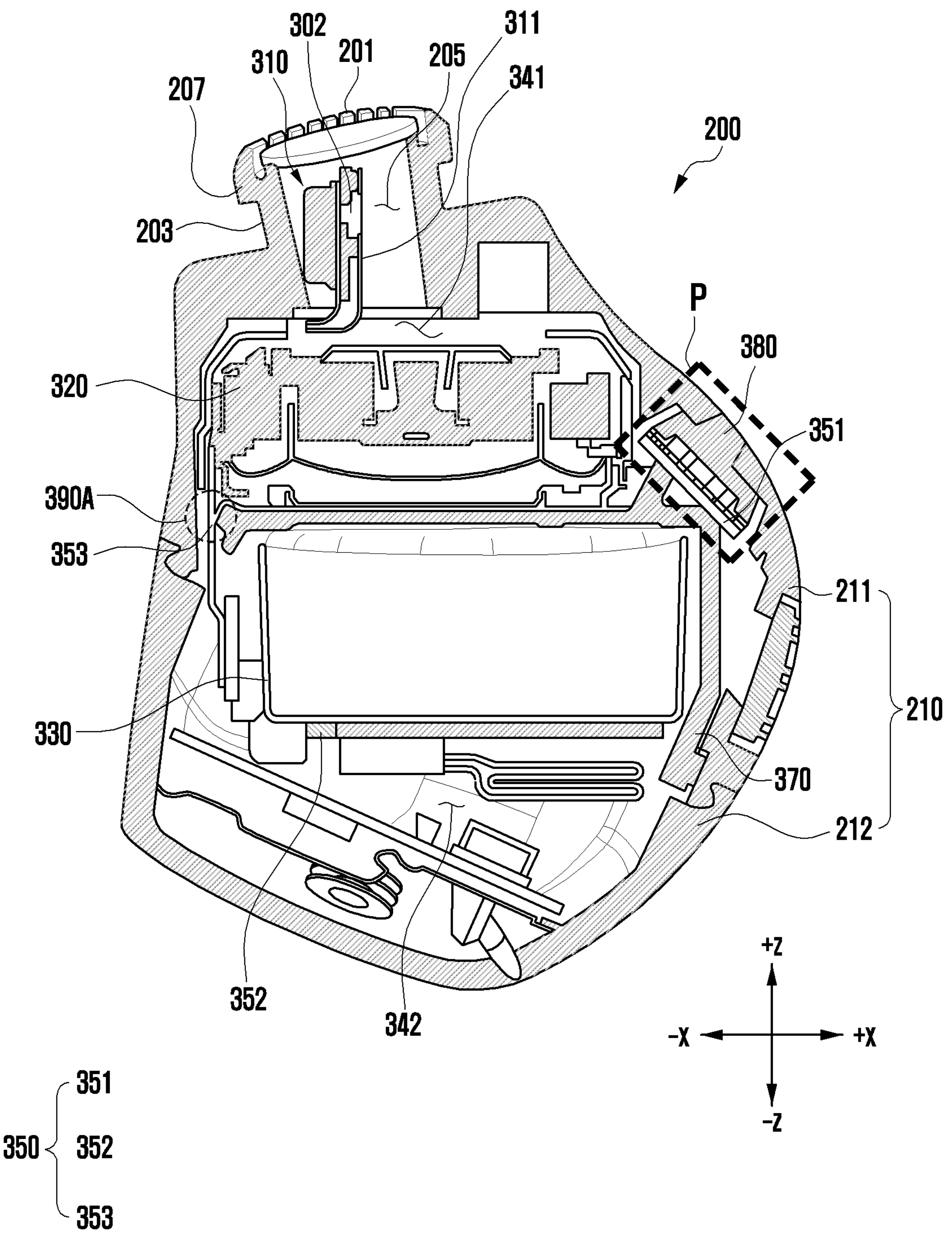
FIG. 3 is a cross-sectional view schematically illustrating a portion a-a' of the electronic device of FIG. 2 according to certain embodiments of the present disclosure.

FIG. 2 is a perspective view illustrating an external appearance of an electronic device (e.g., an audio device) according to certain embodiments of the present disclosure. FIG. 3 is a cross-sectional view schematically illustrating a portion a-a' of the electronic device of FIG. 2 according to certain embodiments of the present disclosure.

According to certain embodiments, the electronic device 200 shown in FIGS. 2 and 3 may be an example of the electronic device 101 described in FIG. 1. Accordingly, even if not mentioned in the following description, the electronic device 200 illustrated in FIGS. 2 and 3 may be interpreted as including at least one of the components described in FIG. 1.

The electronic device 200 disclosed in FIGS. 2 and 3 may be an in-ear type wearable electronic device that can be worn in the user's ear. The in-ear type wearable electronic device may include, for example, at least one of earphones, earbuds, in-ear ear-sets, in-ear headsets, in-ear monitors, and hearing aids. The in-ear type wearable electronic device is not limited to the above examples and may include various other electronic devices that may so include a microphone module and/or a speaker module. The electronic device 200 disclosed in FIGS. 2 and 3 is illustrate as an in-ear type that can be worn on the user's ear, but this is a mere example, and it is understood that the shape of the electronic device 200 in this disclosure is not be limited to an in-ear type.

With reference to FIGS. 2 and 3, the electronic device 200 according to certain embodiments of the present disclosure may include a housing 210, a sound hole 201, a nozzle part 203, a sound conduit 205, a microphone module 310, a speaker module 320, and/or a battery 330.

According to an embodiment, the housing 210 may form the exterior of the electronic device 200. At least a portion of the housing 210 may be insertable into an ear of a user of the electronic device 200. At least a portion of the housing 210 may be formed in a shape that facilitates detachable coupling with the ear (e.g., the ear canal) of the user of the electronic device 200.

According to certain embodiments, at least a portion of the housing 210 may be formed of various materials such as polymers and/or metals. The housing 210 may include a sound hole 201, a nozzle part 203, a sound conduit 205, a microphone module 310, a speaker module 320, and/or a battery 330.

According to an embodiment, the sound hole 201 may be formed at one end (e.g., the nozzle part 203) of the housing 210. The sound hole 201 may include at least one or more openings. The sound hole 201 may be formed at one end of the nozzle part 203. A portion of the sound hole 201 may transmit sound output through the speaker module 320 toward the eardrum of the user of the electronic device 200. A portion of the sound hole 201 may receive the voice of the user voice of the electronic device 200 and transfer it to the microphone hole 302 of the microphone module 310.

According to certain embodiments, the sound hole 201 may include a mesh member. In the case that the sound hole 201 is formed of a mesh member, the mesh member may be coupled to one end surface of the nozzle part 203. The sound hole 201 may form a passage connecting the sound conduit 205 and the exterior environment of the electronic device 200 (e.g., a housing).

According to an embodiment, the nozzle part 203 may be integrally formed with the housing 210. The nozzle part 203 may protrude from a portion of the housing 210 in one direction (e.g., the +Z direction of FIG. 3). At least a portion of the nozzle part 203 may be insertable into and worn in the ear (e.g., the ear canal) of the user of the electronic device 200. The nozzle part 203 may include a sound conduit 205 which forms a sound transmission passage in an interior thereof.

According to certain embodiments, the nozzle part 203 may be formed in a pipe shape to implement a sound conduit 205 in the inside. The nozzle part 203 may have a cylindrical shape. An end of the nozzle part 203 may include at least one sound hole 201.

According to certain embodiments, the nozzle part 203 may include a protrusion 207 formed along one end of a circumference thereof. An ear tip (not shown) may be coupled to the protrusion 207 of the nozzle part 203. The ear tip may be coupled to the outer circumferential surface of one end of the nozzle part 203 through the protrusion 207. At least a portion of the ear tip may be insertable into the ear (e.g., the ear canal) of the user of the electronic device 200, and may contact with the inner surface of the ear canal. The ear tip may be made of a material having some elasticity (e.g., a rubber or a silicone) and may be detachably coupled to the nozzle part 203 through the protrusion 207. At least a portion of the ear tip may be insertable into the ear (e.g., the ear canal) of the user of the electronic device 200 and deformed to fit the shape of the ear canal.

According to an embodiment, the sound conduit 205 may be formed inside the nozzle part 203. The sound conduit 205 may form a transmission passage for voice and/or sound. The sound conduit 205 may transmit sound output through the speaker module 320 to the sound hole 201. The sound conduit 205 may receive a user's voice input through the sound hole 201, and transfer it to the microphone hole 302 of the microphone module 310.

According to certain embodiments, the sound conduit 205 may be formed in a shape corresponding to the nozzle part 203. For example, the sound conduit 205 may be formed in a cylindrical shape. The sound conduit 205 may be configured to communicate with the sound hole 201. The sound conduit 205 may be connected to the sound hole 201.

According to an embodiment, the microphone module 310 may be disposed inside the housing 210. A microphone module 310 may be disposed within the sound conduit 205. The microphone module 310 may be disposed under the sound hole 201 (e.g., the −Z direction of FIG. 3). The microphone module 310 may be disposed between the sound hole 201 and the speaker module 320.

According to certain embodiments, the microphone module 310 may include a microphone hole 302. The microphone hole 302 may be formed in one direction (e.g., the X-axis direction of FIG. 3) of the microphone module 310. The microphone module 310 may receive the voice (e.g., audio) of the user of the electronic device 200, input through the sound hole 201 and the sound conduit 205, through the microphone hole 302, and it may convert the voice into an electrical signal. For example, the microphone module 310 may convert a user's voice, input through the microphone hole 302, into a digital signal. According to an embodiment, the microphone module 310 may be disposed so as to be inclined in a certain direction with the direction of the sound conduit 205. The microphone hole 302 may be disposed to have an obtuse angle with the sound conduit 205.

According to certain embodiments, the microphone module 310 may, as an audio input interface, include one of a dynamic microphone, a condenser microphone, a micro electro mechanical system (MEMS), or a piezo microphone. According to certain embodiments, the electronic device 200 may include a plurality of microphone modules (e.g., the microphone module 310). For example, the microphone module 310 may include a microphone for active noise canceling to remove noise inside the electronic device 200.

According to an embodiment, the speaker module 320 may be disposed under the microphone module 310 (e.g., the −Z direction of FIG. 3). The speaker module 320 may be disposed under the sound conduit 205 (e.g., the −Z direction of FIG. 3). The speaker module 320 may be disposed between the microphone module 310 and the battery 330. The speaker module 320 may convert an electrical signal into sound, and transmit the converted sound to the eardrum of the user of the electronic device 200 through the sound conduit 205 and the sound hole 201. The speaker module 320 may be disposed so as to be inclined in a certain direction with the direction of the sound conduit 205.

According to certain embodiments, the speaker module 320 may be configured to allow the user of the electronic device 200 to listen to various pieces of sound-related information such as playable music or playable multimedia.

According to certain embodiments, the microphone module 310 and the speaker module 320 may be electrically connected to the substrate member 350 disposed inside the housing 210. The microphone module 310 and the speaker module 320 may be electrically connected to one another by the substrate member 350. In an embodiment, the substrate member 350 may include a rigid printed circuit board and a flexible printed circuit board (FPCB).

According to an embodiment, the microphone module 310 and the speaker module 320 may each include a separate printed circuit board separated from the substrate member 350. In this case, a separate printed circuit board separated from the substrate member 350 may be electrically connected to the substrate member 350. For example, the printed circuit board 311 of the microphone module 310, the printed circuit board (not shown) of the speaker module 320, and the printed circuit board of the battery 330 may be electrically connected to the substrate member 350 through a connection member (e.g., FPCB).

For example, the printed circuit board of the speaker module 320 may be electrically connected to the substrate member 350 using a connection member (e.g., FPCB). At least a portion of the printed circuit board 311 of the microphone module 310 may be electrically connected to the substrate member 350 through a connection member (e.g., FPCB) disposed along a sidewall of the speaker module 320.

According to certain embodiments, the printed circuit board of the speaker module 320 and the printed circuit board 311 of the microphone module 310 may be configured as a single substrate. Also, the printed circuit board of the speaker module 320 and the printed circuit board 311 of the microphone module 310 may form a portion of the substrate member 350. In addition, a connection member connecting the printed circuit board of the speaker module 320 and the substrate member 350 and a connection member connecting the printed circuit board 311 of the microphone module 310 and the substrate member 350 may also form a portion of the substrate member.

According to an embodiment, the battery 330 may be disposed below the speaker module 320 (e.g., the −z axis direction). The battery 330 may supply power to at least one component (e.g., the microphone module 310 and/or the speaker module 320) of the electronic device 200. The battery 330 may include, for example, a rechargeable battery.

Figure 7:
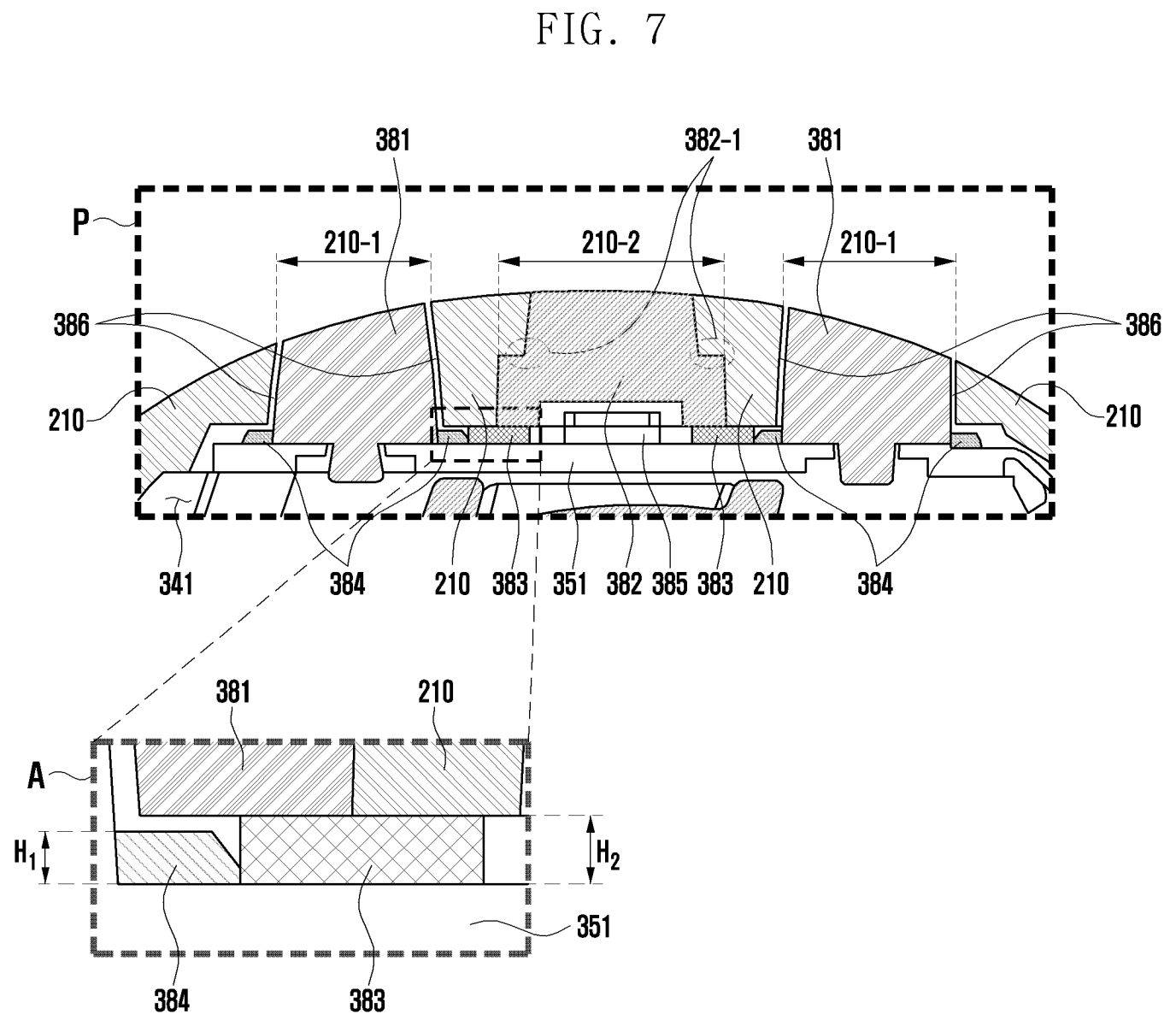

According to certain embodiments, the interface structure 380 may be disposed to be at least partially exposed to the outside of the housing 210 through openings formed in the housing 210 (e.g., the first opening 210-1 and the second opening 210-2 of FIG. 7). For example, as shown in FIG. 2, a window member 382 disposed to cover the connection terminal 381 and the sensor (e.g., the sensor 385 of FIG. 7)

of the interface structure 380 may be recognized from the external environment of the housing 210. A detailed description of the interface structure 380 will be described later.

Figure 4:
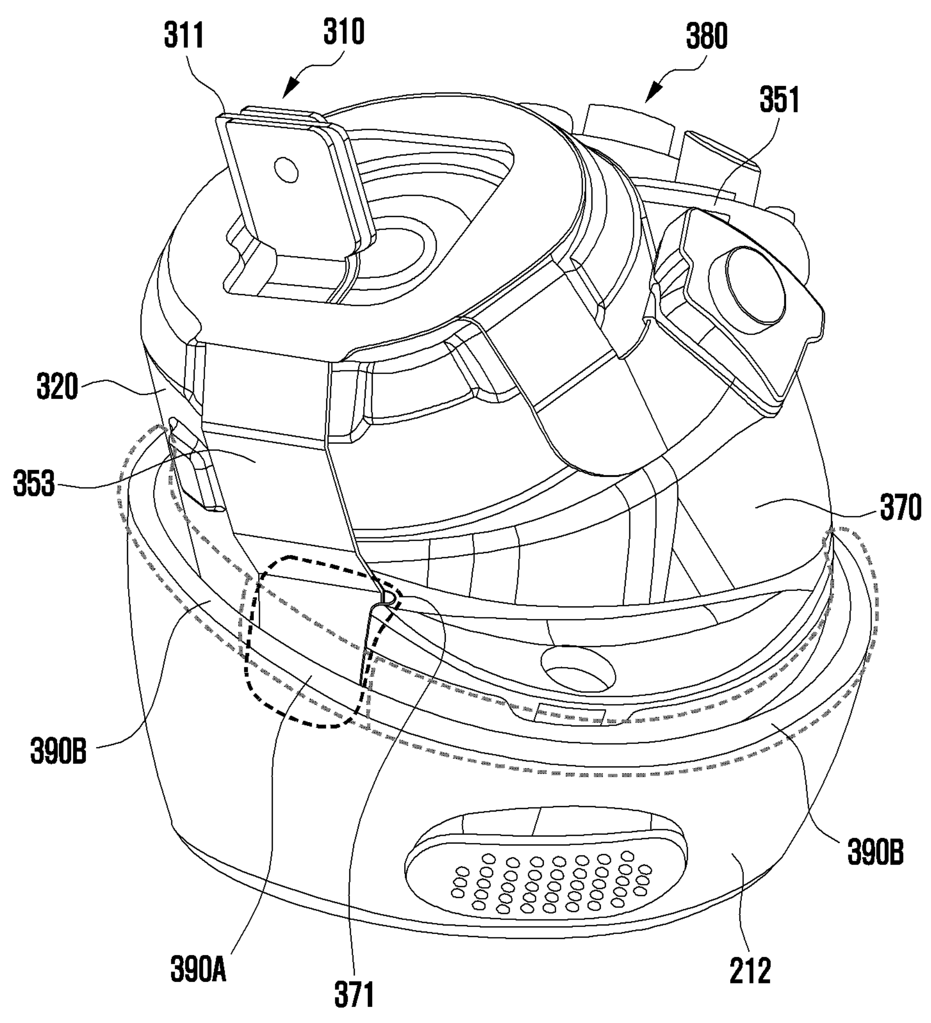
FIG. 4 is a perspective view of an electronic device according to certain embodiments disclosed in the present disclosure in a state in which a housing is partially removed.

FIG. 4 is a perspective view of an electronic device according to certain embodiments disclosed in the present disclosure in a state in which a housing is partially removed. In the following description, the same member numbers are used for elements identical or similar to those described above. In addition, FIG. 4 will be described with reference to FIG. 3.

According to certain embodiments, spaces 341 and 342 may be capable of accommodating various electronic parts and instruments inside the housing 210. In an embodiment, the housing 210 may include a structure in which two housings 211 and 212 are coupled. For example, as shown in FIG. 3, the housing 210 may include a combination of a first housing 211 and a second housing 212.

According to certain embodiments, a bracket 370 may be disposed inside the housing 210. The bracket 370 disposed inside the housing 210 may divide the inner space of the housing 210 into a first space 341 and a second space 342. Different types of electronic components and/or instruments may be disposed between the divided spaces. For example, as shown in FIG. 3, the speaker module 320 may be disposed in the first space 341 and the battery 330 may be disposed in the second space 342. In an embodiment, the first space 341 may be connected to the outside of the housing 210 and the second space 342 may be blocked from the outside of the housing 210. For example, the first space 341 may be connected to the outside of the housing 210 through the sound conduit 205, and the connection of the second space 342 to the first space 341 and the outside may be blocked by the housing 210, the bracket 370 and/or, an airtight member (not shown). The first space 341 connected to the outside of the housing 210 may be a space in which external moisture may flow in, and the second space 342 may be a space in which the flow of moisture from the outside may be blocked. The bracket 370 may be formed of the same material as the housing 210, or of a material different from that of the housing 210; and, in some embodiments, the bracket 370 may be integrally formed with the housing 210. According to certain embodiments, the bracket 370 may support the battery 330 disposed in the second space 342.

According to certain embodiments, an airtight member (not shown) may be disposed between the housing 210 and the bracket 370. The airtight member may block the connection between the first space 341 and the second space 342 of the housing 210. The first space 341 and the second space 342 may be divided by the bracket 370, and may be connected between the bracket 370 and the housing 210. The connection between the first space 341 and the second space 342 may be blocked by disposing the airtight member at the connecting portion. In an embodiment, the first space 341 may be connected to the outside of the housing 210 by a connection conduit (e.g., a connection conduit 386 of FIG. 7) which will be described later. Since the airtight member blocks the connection between the first space 341 and the second space 342, moisture flowing into the first space 341 may not transition into the second space 342. In an embodiment, the airtight member may be formed of a synthetic resin material having adhesiveness and water repellency qualities. For example, the airtight member may be formed of a photocurable resin.

According to certain embodiments, the airtight member may include a first airtight part and a second airtight part. Although not shown, it may be understood that the first airtight part is disposed in the first area 390A shown in FIGS. 3 and 4, so as to provide a seal between the housing and the bracket, and the second airtight part may be disposed in the second area 390B shown in FIG. 4 so as to provide a seal between the housing and the bracket. In an embodiment, the first airtight part may be disposed in the first area 390A, which may be adjacent to the groove 371 formed in the bracket 370. In an embodiment, the first airtight part may be disposed in the first area 390A in a variety of ways. For example, the first airtight part may be disposed in the first area 390A in various ways such as application, attachment, filling, or bonding. The substrate connection part 353 of the substrate member 350 may pass through the groove 371 formed in the bracket 370. The first airtight part may refer to an airtight member that is disposed in an area around the groove 371, through which the substrate connection part 353 may pass. The second airtight part may be disposed in the second area 390B, which may be the area excluding the first airtight part between the housing 210 and the bracket 370. In an embodiment, the second airtight part may be disposed in the second area 390B in a variety of ways. For example, the second airtight part may be disposed in the second area 390B by application, attachment, filling, or bonding.

In an embodiment, the first airtight part may be thicker than the second airtight part. The distance between the groove 371 formed in the bracket 370 and the housing 210 may be greater than the distance between the bracket 370 (in which the groove 371 is not formed) and the housing 210. Accordingly, the first airtight part disposed in the portion where the groove 371 is formed may be thicker than the second airtight part. For example, more material having an airtight function may be applied or disposed in a portion adjacent to the groove 371 formed in the bracket 370. By forming the first airtight part with a greater thickness, the gap between the groove 371 of the bracket 370 and the housing 210 may be blocked. In another embodiment, the first airtight part and the second airtight part may be formed of different materials. For example, the first airtight part may be formed of a silicone material, and the second airtight part may be formed of a photocurable material (e.g., UV curable material). In addition, since the first airtight part may be formed to be thicker than the second airtight part, a material that may be applied with greater thickness may be selected to form the first airtight part. In an embodiment, the groove 371 may be formed in the housing 210 at a portion facing the bracket 370. In addition, the groove 371 may be formed in both the bracket 370 and the housing 210.

In the electronic device disclosed in the present disclosure, moisture may flow into the first space 341 of the inner space of the housing 210. The sound conduit 205 described above may be connected to the first space 341 of the housing 210 so as to form a path through which sound from the speaker is transmitted to the user's ear. Since the first space 341 is not blocked from the outside, moisture may flow into the sound hole 201 connected to the sound conduit 205. Therefore, a separate configuration for blocking moisture (that may be introduced through the sound conduit 205) may not be disposed in the sound conduit 205. A configuration that blocks moisture introduced through the sound conduit 205 may be disposed on a path through which sound generated from the speaker module 320 is transmitted to the user's ear, which may cause volume and sound quality degradation. Since the sound conduit 205 does not require such a component, the sound generated by the speaker module 320 can be transmitted to the user's ear without deterioration in volume and sound quality.

Figure 5:
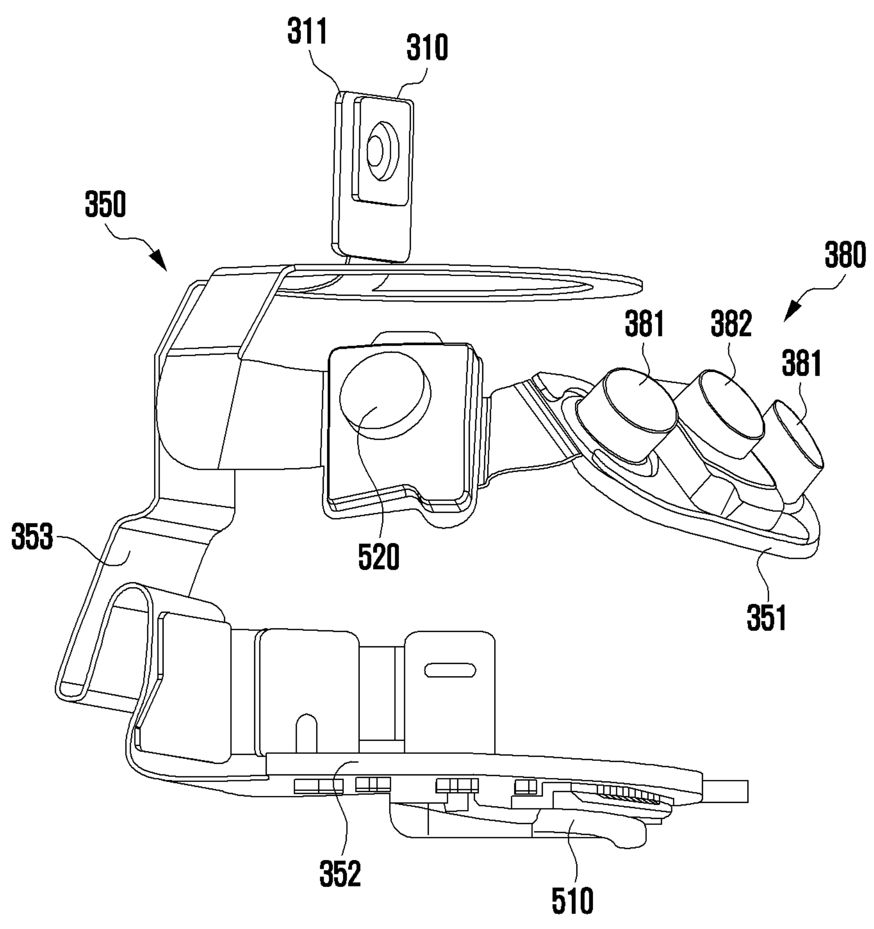
FIG. 5 is a perspective view of a substrate member according to certain embodiments disclosed in the present disclosure.

FIG. 5 is a perspective view of a substrate member according to certain embodiments disclosed in the present disclosure.

In the following description, elements identical to or similar to those described above will be described using the same member numbers. Also, in the following description, reference will be made to FIG. 4 together.

According to certain embodiments, the substrate member 350 may include a first substrate 351, a second substrate 352, and a substrate connection part 353. In an embodiment, the first substrate 351 may be disposed in the first space 341 of the housing 210 and the second substrate 352 may be disposed in the second space 342 of the housing 210. The substrate connection part 353 may electrically connect the first substrate 351 and the second substrate 352. With reference to FIG. 5, in an embodiment, the substrate member 350 may be formed in a shape surrounding the speaker module 320 and the bracket 370. The substrate member 350 may be supported by the speaker module 320 and the bracket 370 so that its position inside the electronic device may be fixed. In an embodiment, the printed circuit board 311 on which the microphone module 310 is disposed may be electrically connected to the substrate member 350.

According to certain embodiments, to connect the first substrate 351 disposed in the first space 341 and the second substrate 352 disposed in the second space 342, a portion of the substrate connection part 353 may pass through a bracket 370 dividing the first space 341 and the second space 342. A groove 371 may be formed on the outer surface of the bracket 370 so that the substrate connection part 353 can pass therethrough. In an embodiment, the interface structure 380 may be disposed on the first substrate 351. A detailed description of the interface structure 380 will be described later. In addition, a power management integrated circuit (PMIC) 510 may be disposed on the second substrate 352 located in the second space 342 where the battery 330 is disposed.

According to an embodiment, a sensor (not shown) distinct from the sensor 385 disposed on the interface structure 380 may be connected to the substrate member 350 at a position distinct from the interface structure 380. A window member 520 for protecting the sensor (not shown) may be disposed to cover the sensor (not shown). The window member 520 may perform substantially the same function as the window member 382 included in the interface structure 380.

In an embodiment, a connection terminal may be connected to the substrate member 350 at a position distinct from the interface structure 380. Since the connection terminal performs substantially the same function as the connection terminal 381 included in the interface structure 380, a description of the connection terminal 381 included in the interface structure 380 will be a substitute.

In an embodiment, the first substrate 351, the second substrate 352, and the substrate connection part 353 may be integrally formed. In addition, the substrate connection part 353 may be integrally formed with one of the first substrate 351 and the second substrate 352 and coupled to the other substrate. In an embodiment, the substrate connection part 353 may be a flexible printed circuit board (FPCB) or a portion thereof.

Figure 6A:
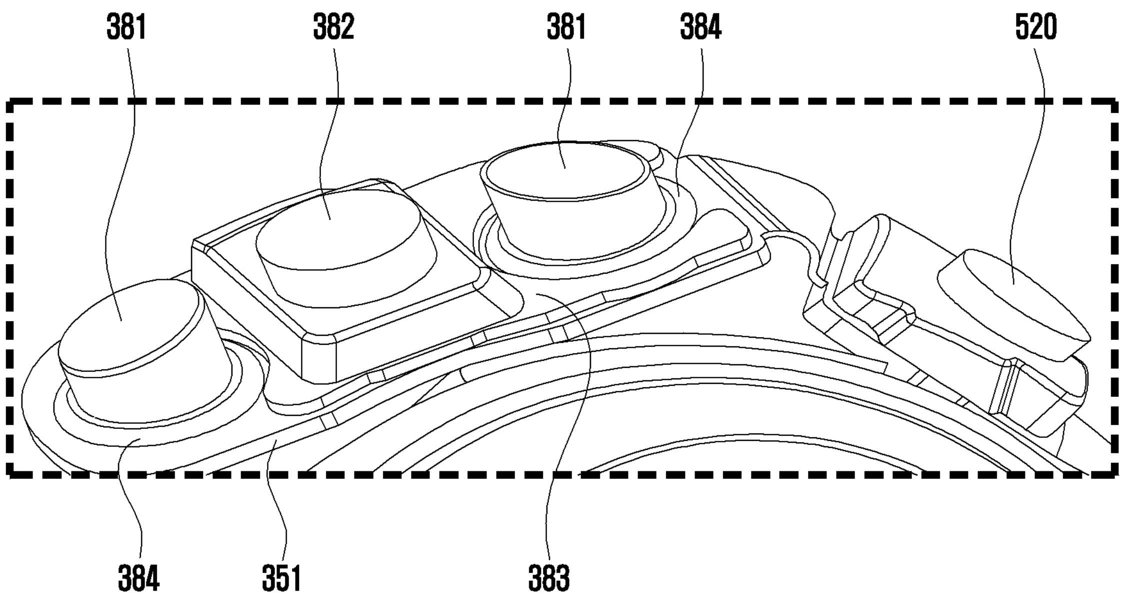
FIG. 6*a* is a front perspective view of an interface structure in accordance with certain embodiments disclosed in the present disclosure.
Figure 6B:
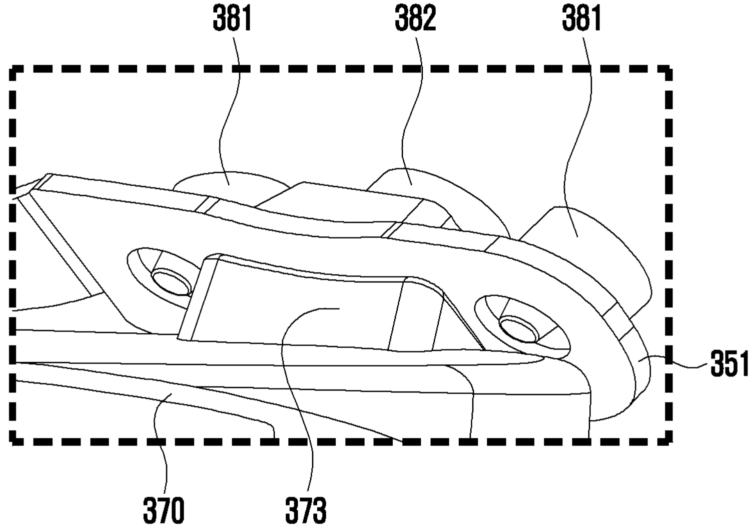
FIG. 6*b* is a rear perspective view of the interface structure shown in FIG. 6*a*.

FIG. 6*a* is a front perspective view of an interface structure in accordance with certain embodiments disclosed in the present disclosure. FIG. 6*b* is a rear perspective view of the interface structure shown in FIG. 6*a*. FIG. 7 is a cross-sectional view of the interface structure in which region P of FIG. 3 is enlarged. In the following description, the same member numbers are used for elements identical or similar to those described above.

According to certain embodiments, the interface structure 380 may be disposed on the first substrate 351 of the substrate member 350. Since the first substrate 351 is disposed in the first space 341, the interface structure 380 may also be disposed in the first space 341.

According to certain embodiments, at least a portion of the interface structure 380 may be disposed to be fitted into an opening (e.g., a first opening 210-1 or a second opening 210-2) of the housing 210. With reference to FIG. 6*b*, a portion of the interface structure 380 may be supported by a bracket 370. For example, as shown in FIG. 6*b*, the bracket 370 may include a support part 373 protruding toward the first substrate 351 to support the first substrate 351. The position of the interface structure 380 may be fixed in the housing 210 by a portion of the interface structure 380 being inserted into the openings (the first opening 210-1 and the second opening 210-2) of the housing 210 and being supported by the support part 373.

According to certain embodiments, the interface structure 380 may include a substrate 351, a connection terminal 381, a sealing part 384, a sensor 385, a window member 382, a waterproofing member 383, and a connection conduit 386. Here, the substrate 351 may be the first substrate 351 of the substrate member 350.

According to certain embodiments, the connection terminal 381 may be inserted into the first opening 210-1 formed in the housing 210 and at least partially be exposed to the outside of the housing 210. The connection terminal 381 may contact an external terminal included in an external electronic device (e.g., an electronic device case or a charging device). In the case that the connection terminal 381 contacts an external terminal, the electronic device and the external electronic device may be electrically connected. Through this, charging and data transmission may be performed. In an embodiment, the connection terminal 381 may be a pogo-pin. In an embodiment, the connection terminal 381 may be plural as shown in FIG. 6*a*. For example, as shown in FIG. 7, the connection terminals 381 may be disposed on both sides of the sensor 385 (or the window member 382).

According to certain embodiments, the connection conduit 386 may connect the outside of the housing 210 and the inside of the housing 210. In the case that the inner space of the housing 210 is divided into the first space 341 and the second space 342 by the bracket 370, the outside of the housing 210 and the first space 341 may be connected by the connection conduit 386. In an embodiment, as shown in FIG. 7, the connection conduit 386 may be a gap formed between the connection terminal 381 and the first opening 210-1. The outer space of the housing 210 and the inner space of the housing 210 may be connected by the connection conduit 386. For example, the first space 341 and the outside of the connection conduit 386 may be connected.

According to certain embodiments, the connection terminal 381 may be electrically connected to the substrate 351 by being disposed on the substrate 351 using various surface mount technology (SMT) methods. For example, the connection terminal 381 may be electrically connected to the substrate 351 through soldering. External moisture introduced through the connection conduit 386 may flow into the connection terminal 381. A sealing part 384 may be disposed at a portion where the connection terminal 381 is connected to the substrate 351.

According to certain embodiments, the sealing part 384 may be disposed at a connection portion between the connection terminal 381 and the substrate 351 to block external exposure of the connection portion. For example, as shown in FIG. 6*a*, in the case that the connecting portion between the connection terminal 381 and the substrate 351 is formed along the outer circumference of the connection terminal 381, the sealing part 384 may also be disposed along the outer circumference of the connection terminal 381. The sealing part 384 may be formed of various materials having insulating properties. For example, the sealing part 384 may be formed of a photocurable adhesive material (e.g., a UV curable adhesive material). Since the sealing part 384 blocks external exposure of the connection portion, even if moisture flows into the vicinity of the connection terminal 381, a problem such as a short caused by moisture may not occur.

According to certain embodiments, the sensor 385 may be disposed on the substrate 351 at a location adjacent to the connection terminal 381. In an embodiment, the sensor 385 may be a proximity sensor 385 capable of detecting the proximity of a specific object. The sensor 385 may be a sensor 385 that detects proximity of a specific object using light. For example, the sensor 385 may be an infrared sensor 385 using light of an infrared wavelength.

According to certain embodiments, the window member 382 may cover the sensor 385 by being formed in a shape capable of covering the sensor 385 and disposed on the substrate 351. The window member 382 may block the sensor 385 from being exposed to the outside of the housing 210 on the substrate 351. A portion of the window member 382 may be exposed to the outside of the housing 210 by being inserted into the second opening 210-2 formed in the housing 210. The window member 382 may be formed of a material capable of transmitting light of a wavelength used by the sensor 385. For example, in the case that the sensor 385 is an infrared sensor using infrared light, the window member 382 may be formed of a material capable of transmitting infrared wavelength light. In an embodiment, the window member 382 may include a locking protrusion 382-1. With reference to FIG. 7, the second opening 210-2 may be formed in a shape corresponding to the locking protrusion 382-1 of the window member 382. For example, in the second opening 210-2, a portion corresponding to the locking protrusion 382-1 may have a larger inner diameter than a portion where the window member 382 is exposed to the outside of the housing 210. Because of the corresponding shapes of the locking protrusion 382-1 and the second opening 210-2, the position of the window member 382 may be fixed while being inserted into the second opening 210-2.

According to certain embodiments, the waterproofing member 383 may be disposed between the window member 382 and the substrate 351 to provide airtightness between the window member 382 and the substrate 351. Since the airtightness between the window member 382 and the substrate 351 prevents moisture from entering the space where the sensor 385 covered by the window member 382 is disposed; even if some moisture is introduced through the connection conduit 386, the waterproofing member 383 provides airtightness between the window member 382 and the substrate 351, and so the introduced moisture cannot move toward the sensor 385. Because of such a waterproof structure, moisture may not be introduced into the sensor 385 disposed in the first space 341 where moisture is allowed to flow.

According to certain embodiments, a height H2 of the waterproofing member 383 relative to the substrate 351 may be greater than a height H1 of the sealing part 384 relative to the substrate 351. Since the height H1 of the sealing part 384 is smaller than the height H2 of the waterproofing member 383, the sealing part 384 may not push the window member 382 away from the substrate 351 even though a portion of the sealing part 384 is disposed adjacent to the waterproofing member 383 as shown in area A of FIG. 7. In the case that an O-ring capable of elastic deformation is used, there has been a problem of the window member 382 being pushed while the O-ring compressed by the window member 382 is being restored. In this case, the adhesion between the window member 382 and the waterproofing member 383 may be released by the restorative force of the O-ring, so that the waterproof structure may not be maintained. In certain embodiments disclosed in the present disclosure, the conventional problem can be solved by using a sealing part 384 formed of a UV curable material and disposing the sealing part 384 to have a height lower than that of the waterproofing member 383.

An electronic device (e.g., the electronic device 200 of FIG. 2) according to certain embodiments disclosed in the present disclosure may include a housing (e.g., the housing 210 of FIG. 2) and an interface structure (e.g., the interface structure 380 of FIG. 2) of which at least a portion is disposed in the housing, wherein the interface structure may include a substrate (e.g., the substrate 351 of FIG. 7); a connection terminal (e.g., the connection terminal 381 of FIG. 7) that is disposed on the substrate such that at least a portion of the connection terminal is exposed to the outside through a first opening (e.g., the first opening 210-1 of FIG. 7) of the housing; a sealing part (e.g., the sealing part 384 of FIG. 7) that is disposed at a portion where the substrate and the connection terminal are connected so as to block the exposure of the connected portion; a sensor (e.g., the sensor 385 of FIG. 7) that is disposed on the substrate in a position adjacent to the connection terminal; a window member (e.g., the window member 382 of FIG. 7) that is disposed on the substrate so as to cover the sensor and have at least a portion of the sensor exposed to the outside through a second opening (e.g., the second opening 210-2 of FIG. 7) of the housing; and a waterproofing member (e.g., the waterproofing member 383 of FIG. 7) that is disposed between the window member and the substrate so as to seal a portion between the window member and the substrate.

In addition, the interface structure may further include a connection conduit (e.g., the connection conduit 386 of FIG. 7) connecting the outside of the housing and the inner space of the housing.

In addition, the sealing part of the interface structure may have a height (e.g., H1 in FIG. 7) relative to the substrate equal to or smaller than a height (e.g., H2 in FIG. 7) of the waterproofing member relative to the substrate.

In addition, a bracket (e.g., the bracket 370 of FIG. 3) disposed inside the housing to divide the inner space of the housing into a first space (e.g., the first space 341 in FIG. 3) and a second space (e.g., the second space 342 in FIG. 3) may be further included.

In addition, the connection conduit of the interface structure may connect the outside of the housing and the first space of the housing, the housing being divided by the bracket, and the connection conduit may be the space between the connection terminal of the interface structure and the first opening of the housing.

In addition, an airtight member disposed between the bracket and the housing to block the connection between the first space and the second space may be further included.

In addition, the bracket may further include a support part (e.g., the support part 373 of FIG. 6*b*) for supporting the interface structure.

In addition, the window member of the interface structure may be formed with a locking protrusion (e.g., the locking protrusion 382-1 of FIG. 7) to be caught in the second opening.

In addition, the sealing part of the interface structure may include an ultraviolet (UV) curable adhesive material.

An electronic device (e.g., the electronic device 200 of FIG. 2) according to certain embodiments disclosed in the present disclosure may include a housing (e.g., the housing 210 of FIG. 2); a bracket (e.g., the bracket 370 of FIG. 3) disposed inside the housing to divide the housing into a first space (e.g., the first space 341 of FIG. 3) and a second space (e.g., the second space 342 of FIG. 3); an airtight member disposed between the housing and the bracket to block the connection of the first space and the second space; a substrate member (e.g., the substrate member 350 of FIG. 3) including a first substrate (e.g., the first substrate 351 of FIG. 3) disposed in the first space, a second substrate (e.g., the second substrate 352 of FIG. 3) disposed in the second space, and a substrate connection part (e.g., the substrate connection part 353 of FIG. 3) connecting the first substrate and the second substrate; and an interface structure (e.g., the interface structure 380 of FIG. 2) including a sensor (e.g., the sensor 385 of FIG. 7) and a connection terminal (e.g., the connection terminal 381 of FIG. 7) and disposed in a first substrate of the substrate member, wherein the substrate connection part of the substrate member may connect the first substrate and the second substrate by at least a portion of the substrate connection part passing through a groove (e.g., the groove 371 of FIG. 4) formed on the bracket.

In addition, the airtight member may include a first airtight part positioned adjacent to the groove formed in the bracket and a second airtight part positioned in a portion other than a portion where the first airtight part is positioned.

In addition, in the airtight member, the thickness of the first airtight part may be formed thicker than the thickness of the second airtight part.

In addition, in the airtight member, the first airtight part and the second airtight part may be formed of different materials.

In addition, in the airtight member, the first airtight part may be formed of a silicone adhesive material, and the second airtight part may be formed of a UV curable material.

In addition, the interface structure may include a connection conduit (e.g., the connection conduit 386 of FIG. 7) connecting the outside of the housing and the first space.

In addition, the interface structure may include a substrate (e.g., the substrate 351 of FIG. 7) on which the sensor and the connection terminal are disposed; a sealing part (e.g., the sealing part 384 of FIG. 7) that is disposed at a portion where the substrate and the connection terminal are connected so as to block exposure of the connected portion; a window member that is disposed on the substrate so as to cover the sensor and have at least a portion of the sensor exposed to the outside through a second opening (e.g., the second opening 210-2 of FIG. 7) of the housing; and a waterproofing member (e.g., the waterproofing member 383 of FIG. 7) that is disposed between the window member and the substrate so as to seal a portion between the window member and the substrate, wherein at least a portion of the connection terminal of the infrastructure may be exposed to the outside of the housing through a first opening (e.g., the first opening 210-1 of FIG. 7) formed in the housing.

In addition, the connection conduit of the interface structure may be a space between the connection terminal and the first opening.

In addition, the sealing part of the interface structure may have a height (e.g., H1 in FIG. 7) relative to the substrate equal to or smaller than a height (e.g., H2 in FIG. 7) of the waterproofing member relative to the substrate.

In addition, the bracket may further include a support part (e.g., the support part 373 of FIG. **6*b***) for supporting the interface structure.

In addition, the window member of the interface structure may be formed with a locking protrusion (e.g., the locking protrusion 382-1 of FIG. 7) to be caught in the first opening.

Also, embodiments disclosed in the specification and drawings of the present disclosure are merely presented as specific examples to easily explain the technical content according to the embodiments of the disclosure and help an understanding of the embodiments of the disclosure, and they are not intended to limit the scope of the embodiments of the disclosure. Therefore, all changes or modifications derived from the technical ideals of the certain embodiments of the disclosure should be interpreted to be included in the scope of the certain embodiments of the disclosure in addition to the embodiments disclosed in the present disclosure.

What is claimed is:

1. An electronic device, comprising:

a housing including an opening, and a speaker disposed in the opening; and an interface structure at least partly disposed in the housing, wherein the interface structure comprises:

a substrate electrically connected to the speaker by an electrical connection within the housing;

a connection terminal disposed on the substrate such that at least a portion of the connection terminal is exposed to an external environment through a first opening of the housing;

a sealing part disposed where the substrate and the connection terminal are connected, so as to block exposure of the connected portion to the external environment;

a sensor disposed on the substrate in a position adjacent to the connection terminal;

a window member that is disposed on the substrate so as to cover the sensor while exposing at least a portion of the sensor to the external environment through a second opening of the housing; and a waterproofing member disposed between the window member and the substrate so as to form a seal between a portion of the window member and the substrate.

2. The electronic device of claim 1, wherein the interface structure further comprises a connection conduit connecting an exterior of the housing and an inner space formed within the housing.

3. The electronic device of claim 1, wherein the sealing part of the interface structure has a height relative to the substrate equal to or smaller than a height of the waterproofing member relative to the substrate.

4. The electronic device of claim 1, further comprising a bracket disposed inside the housing so as to divide an inner space of the housing into a first space and a second space.

5. The electronic device of claim 4, wherein a connection conduit of the interface structure connects an exterior of the housing and the first space of the housing, wherein the housing is divided by the bracket, and wherein the connection conduit defines a space between the connection terminal of the interface structure and the first opening of the housing.

6. The electronic device of claim 5, further comprising an airtight member disposed between the bracket and the housing, so as to block a connection between the first space and the second space.

7. The electronic device of claim 4, wherein the bracket includes a support part supporting the interface structure.

8. The electronic device of claim 1, wherein the window member of the interface structure is formed with a locking protrusion so as to be caught in the second opening.

9. The electronic device of claim 1, wherein the sealing part of the interface structure includes ultraviolet (UV) curable adhesive materials.

10. The electronic device of claim 1, further comprising:

a bracket disposed within the housing so as to divide the housing into a first space and a second space;

an airtight member disposed between the housing and the bracket, blocking connection between the first space and the second space;

wherein the substrate member includes a first substrate disposed in the first space, a second substrate disposed in the second space, and a substrate connection part connecting the first substrate and the second substrate;

where in interface structure is disposed on the first substrate, and wherein the substrate connection part of the substrate connects the first substrate and the second substrate, by at least a portion of the substrate connection part that passes through a groove formed on the bracket.

11. The electronic device of claim 10, wherein the airtight member includes a first airtight part disposed adjacent to the groove that is formed in the bracket, and a second airtight part disposed in a position other where the first airtight part is positioned.

12. The electronic device of claim 11, wherein a thickness of the first airtight part is greater than a thickness of the second airtight part.

13. The electronic device of claim 11, wherein the first airtight part and the second airtight part are formed of different materials.

14. The electronic device of claim 13, wherein the first airtight part is formed of a silicone adhesive material, and the second airtight part is formed of an ultraviolet (UV) curable material.

15. The electronic device of claim 10, wherein the interface structure further includes a connection conduit connecting an exterior of the housing and the first space.

16. The electronic device of claim 1, wherein the portion of the connection terminal is configured to establish an electrical connection by contact with a terminal in an external electronic device.

17. The electronic device of claim 1, wherein the sensor comprises a proximity sensor.

* * * * *